(12) United States Patent
Emoto et al.

(10) Patent No.: US 7,038,759 B2
(45) Date of Patent: May 2, 2006

(54) EXPOSURE APPARATUS

(75) Inventors: Keiji Emoto, Tochigi (JP); Hirohide Matsuhisa, Kanagawa (JP); Kotaro Akutsu, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/187,841

(22) Filed: Jul. 3, 2002

(65) Prior Publication Data

US 2003/0007136 A1 Jan. 9, 2003

(30) Foreign Application Priority Data

| Jul. 9, 2001 | (JP) | ............ 2001-207363 |
| Jul. 10, 2001 | (JP) | ............ 2001-208961 |
| Sep. 11, 2001 | (JP) | ............ 2001-274762 |

(51) Int. Cl.
*G03B 27/52* (2006.01)
*G03B 27/42* (2006.01)
*G03B 27/58* (2006.01)
*H02K 41/00* (2006.01)

(52) U.S. Cl. ............... 355/30; 355/53; 355/72; 310/12

(58) Field of Classification Search ............ 355/30, 355/53, 72, 76; 510/247; 318/650; 310/12
See application file for complete search history.

(56) References Cited

U.S. PATENT DOCUMENTS

| 4,720,732 | A | * | 1/1988 | Tsutsui ............ 355/30 |
| 5,063,582 | A | * | 11/1991 | Mori et al. ........ 378/34 |
| 5,190,627 | A | * | 3/1993 | Saito et al. ....... 204/158.2 |
| 5,220,171 | A | * | 6/1993 | Hara et al. ........ 250/443.1 |
| 5,231,291 | A | * | 7/1993 | Amemiya et al. ... 250/443.1 |
| 5,577,552 | A | * | 11/1996 | Ebinuma et al. .... 165/296 |
| 5,696,623 | A | * | 12/1997 | Fujie et al. ....... 359/350 |
| 5,864,386 | A | * | 1/1999 | Nei ................ 355/30 |
| 5,959,732 | A | | 9/1999 | Hara et al. ........ 356/358 |
| 6,084,319 | A | | 7/2000 | Kamata et al. ..... 310/12 |
| 6,226,073 | B1 | * | 5/2001 | Emoto ............. 355/53 |
| 6,437,851 | B1 | * | 8/2002 | Hagiwara .......... 355/30 |
| 6,444,047 | B1 | * | 9/2002 | Miyazaki .......... 134/36 |
| 6,509,951 | B1 | * | 1/2003 | Loopstra et al. ... 355/30 |
| 6,559,924 | B1 | * | 5/2003 | Ina et al. ......... 355/53 |
| 6,590,355 | B1 | | 7/2003 | Kikuchi et al. .... 318/135 |
| 6,608,666 | B1 | * | 8/2003 | Deguchi et al. .... 355/53 |
| 2003/0019783 | A1 | * | 1/2003 | Munakata .......... 206/711 |

FOREIGN PATENT DOCUMENTS

| JP | 6-281389 | 10/1994 |
| JP | 7-302124 | 11/1995 |
| JP | 7-302747 | 11/1995 |
| JP | 9-289750 | 11/1997 |
| JP | 10-262351 | 9/1998 |
| JP | 1-245893 | 10/1998 |
| JP | 10-309071 | 11/1998 |
| JP | 2000-336351 | 12/2000 |
| JP | 2000-348932 | 12/2000 |
| JP | 2000-350414 | 12/2000 |
| KR | 1999-0081332 | 11/1999 |
| KR | 1999-0083450 | 11/1999 |

OTHER PUBLICATIONS

Korean Office Action dated Jun. 22, 2004, issued in a corresponding Korean patent application, No. 10-2002-0039264.

* cited by examiner

*Primary Examiner*—Alan Mathews
(74) *Attorney, Agent, or Firm*—Fitzpatrick, Cella, Harper & Scinto

(57) ABSTRACT

An exposure apparatus which exposes a substrate to a pattern. The apparatus includes a channel which causes pure water to flow as a coolant, a temperature adjustment unit which adjusts a temperature of the pure water flowing in the channel, and a coolant generation device which generates the pure water flowing in the channel as the coolant with a resistivity of not less than 1 MΩ·cm.

9 Claims, 15 Drawing Sheets

FIG. 12

URL http://www.maintain.co.jp/db/input.html

TROUBLE DB INPUT WINDOW

DATE OF OCCURRENCE OF TROUBLE [2000/3/15] ~ 1404
MODEL [* * * * * * * * *] ~ 1401
TROUBLE CASE NAME [OPERATION ERROR (START-UP ERROR)] ~ 1403
SERIAL NUMBER [465NS4580001] ~ 1402
EMERGENCY LEVEL [D] ~ 1405
PROBLEM [LED KEEPS FLICKERING AFTER POWER ON] ~ 1406
REMEDY [POWER ON AGAIN (PRESS RED BUTTON IN ACTIVATION)] ~ 1407
PROGRESS [INTERIM HAS BEEN DONE] ~ 1408

[SEND] [RESET]  1410  1411  1412
LINK TO RESULT LIST DATABASE  SOFTWARE LIBRARY  OPERATION GUIDE

EXPOSURE APPARATUS

FIELD OF THE INVENTION

The present invention relates to an exposure apparatus used in a semiconductor manufacturing process, and is particularly suitable for temperature control in the apparatus.

BACKGROUND OF THE INVENTION

As a conventional cooling method performed for an alignment device in an exposure apparatus, a temperature-managed fluorine-based inert coolant is generally circulated through a heating member such as a driving unit and a temperature adjustment device, as shown in FIG. 8. In the prior art shown in FIG. 8, the alignment device in the exposure apparatus is illustrated. A measurement distance 13 to an object 10 to be aligned is detected by using a measurement mirror 11 and a position measurement means 12 such as a laser interferometer, thereby measuring the position of the object 10 at high precision. A linear motor 1 is controlled by a controller 14 and a driver 15 on the basis of the measurement result. The linear motor 1 made up of stator 1a and rotor 1b is kept at a predetermined temperature by circulating a fluorine-based inert coolant 2 through a temperature adjustment device 6 and channel 7 in a temperature adjustment room. As disclosed in Japanese Patent Laid-Open No. 10-309071, the linear motor 1 has a jacket structure in which a coolant directly recovers the heat generated by a coil. As the coolant, the fluorine-based inert coolant 2 is used because of the following reasons.
1. The fluorine-based inert coolant is a chemically stable liquid, does not degrade or decay, and does not require any maintenance.
2. The fluorine-based inert coolant does not induce any rust and form any rust in a pipe or at a joint. Even if this coolant leaks, it hardly influences the interior of the apparatus.
3. The electrical insulating property of the fluorine-based inert coolant is very high (about $10^{15} \Omega \cdot cm$). Directly cooling a coil or the like does not impair the insulating property.

A circulation cooling technique for a coolant other than the fluorine-based inert coolant adopts a gas coolant such as air or carbonic acid gas, an antifreeze coolant such as oil or brine (ethylene glycol-based or propylene glycol-based), or water containing various additives such as a rust preventive and preservative.

The fluorine-based inert coolant has advantages described in the prior art, but also has the following disadvantages.
1. The unit cost is very high.
2. The warming potential is high.
3. The heat capacity (specific heat×density) per unit volume is as small as about ½ that of water.

The unit cost of the fluorine-based inert coolant is about 10 to 50 times higher than those of additive-containing water or various coolants such as brine. This increases the cost of an exposure apparatus which requires a large amount of coolant. The fluorine-based inert coolant does not decompose even in air owing to high chemical stability, and is pointed out to have a very high GWP (Global Warming Potential). The use of the inert coolant in an open system is, therefore, being reviewed, and for the user of the inert coolant in a closed circulation system, an alternate coolant is being examined for a long term.

In addition to this, a higher-output driving unit and higher cooling ability are demanded especially for the exposure apparatus. To improve the cooling ability, it is possible to (1) to increase the coolant flow rate, (2) to decrease the coolant temperature, or (3) to increase the heat capacity of the coolant. As the coolant flow rate increases, necessary pump ability increases with its square. The pump becomes bulky and a higher flow rate is difficult to ensure. If the flow rate of a circulating coolant near an object to be aligned as an object subjected to temperature control is set to be higher than the conventional value, the coolant forms turbulence, vibrating a pipe or the like. The vibrations function as alignment disturbance, decreasing the alignment precision and further, the exposure precision. For this reason, the flow rate of the coolant cannot be simply increased. At an excessively low coolant temperature, air around the coolant path becomes nonuniform in temperature in comparison with the entire atmosphere. An interferometer laser for position measurement fluctuates in output, and the measurement precision and exposure precision decrease. From this, the use of an alternate coolant with a large heat capacity in place of the fluorine-based inert coolant has been examined.

Examples of such large-heat-capacity coolant are water (pure water) containing a rust preventive or preservative, and brine (coolant prepared by diluting an ethylene glycol-based or propylene glycol-based antifreeze with water). These coolants are actually used in various machine tools. If, however, water or brine is circulated as a coolant for a long time, rust forms on a metal surface of a pipe or the like that contacts the coolant, or the coolant decays due to breeding of unwanted bacteria or the like. To prevent this, water or brine containing a rust preventive or preservative is generally used as a coolant. Most rust preventives, however, contain a metal salt such as sodium ions or amine-based ions in order to dissolve the rust preventives in water. Many preservatives contain an amine-based component in addition to an alcoholic component in order to enhance the sterilization effect.

In addition, these coolants do not have the electrical insulating property of the conventional coolant, i.e., fluorine-based inert coolant, and the conventional structure of directly cooling an electrical component cannot be employed. Hence, a coolant which can ensure an electrical insulating property is required for the exposure apparatus instead of the fluorine-based inert coolant.

A semiconductor factory must maintain a very clean space. Contamination of the atmosphere not only by a fine organic matter such as dust but also by metal ions or amine-based organic ions must be minimized in terms of the semiconductor manufacturing process. Considering this, a coolant or the like used in the exposure apparatus preferably contains no metal salt or amine-based ions which act as contaminants (contamination) in case the coolant leaks from a pipe or the like. If these contaminants are at negligible level for the factory, but the coolant leaking from a pipe or the like attaches to a precision surface plate or the like, the coolant volatilizes to leave the additive component on the surface of the precision surface plate. The additive component may then influence the surface precision of the surface plate. In many cases, the precision surface plate serves as an alignment reference in the alignment device of the exposure apparatus. The decrease in precision seriously influences the alignment precision and exposure precision. Demands have therefore arisen for a coolant which does not leave any residue even upon volatilization.

In order to obtain a coolant having a large heat capacity and electrical insulating property, it has been examined to adjust the temperature in the exposure apparatus via pure water managed to 1 $M\Omega \cdot cm$ or more (0.1 $\mu S/cm$ or less).

This also means that pure water does not contain any contaminant which adversely affects the manufacturing process of the semiconductor factory.

Implementation of such a process and coolant requires a pure water device and accessory device (deoxidation device or sterilization device such as a UV filter), resulting in a large equipment space.

Addition of a rust preventive or preservative also poses a maintenance problem. To maintain the effects of these additives, the concentrations of the additives must be managed. Since the concentration cannot always be monitored, it must be periodically checked at least every one or two months. This increases the maintenance burden of the semiconductor manufacturing apparatus, and further increases the burden on the user. To avoid the increase in burden, it is preferable to always monitor maintenance and management of the rust prevention effect.

In general, quality management of the coolant requires periodic maintenance. Most exposure apparatuses operate for 24 hours, and the maintenance burden is desirably decreased as much as possible.

SUMMARY OF THE INVENTION

It is an object of the present invention to provide an exposure apparatus which can be made compact and can suppress metal rust that forms in a pipe or the like in the presence of a coolant without adversely affecting a clean semiconductor factory.

It is another object of the present invention to provide an exposure apparatus which can suppress decay of a coolant without adversely affecting a clean semiconductor factory.

It is still another object of the present invention to provide an exposure apparatus which can employ pure water as a coolant for cooling a driving unit or the like, is compact, and comprises a small-size alignment device and the like.

To achieve the above objects, according to the present invention, there is provided an exposure apparatus which exposes a substrate to a pattern on a master, comprising a temperature adjustment unit which adjusts, to a predetermined temperature, a coolant supplied from a coolant generation device which generates a coolant with a predetermined quality, and a control unit which controls a temperature in the apparatus by circulating the coolant adjusted to the predetermined temperature.

It is preferable that the coolant include distilled water or pure water, and be supplied from the coolant generation device arranged outside the exposure apparatus. The pure water has a resistivity of 1 MΩ·cm or more. The pure water includes deoxidized water.

The pure water preferably has a dissolved oxygen amount of 1 mg/l or less. The deoxidized water includes deaerated water having undergone deaeration processing.

If the coolant is water in the above arrangement, the heat capacity of the coolant can be set large to provide a cooling effect. The use of distilled or pure water as a coolant can prevent contamination of a factory atmosphere even if the coolant leaks outside the apparatus. Distilled or pure water used does not leave any residue even upon volatilization. Even if the coolant leaks from a pipe or the like within the apparatus, the alignment precision and exposure precision do not decrease.

By supplying part or all of pure water from a factory or the like, the exposure apparatus can be made compact, and a cooling system using pure water can be implemented. Since the resistivity of pure water supplied from the factory or the like is set to 1 MΩ·cm or more, insulation of the coil and reliability can be ensured. The arrangement of supplying deoxidized (deaerated) pure water from the factory or the like results in a compact deoxidization unit and thus a very compact exposure apparatus. As long as the amount of oxygen dissolved in deoxidized pure water is 1 mg/l or less, the deoxidation unit need not be installed in the exposure apparatus, further downsizing the exposure apparatus.

The exposure apparatus further comprises at least one of a deoxidation unit which performs deoxidation processing for the coolant and a UV sterilization unit which performs UV sterilization processing for the coolant. The deoxidation unit preferably has a deaeration function of removing gas from the coolant. Alternatively, the deoxidation unit fills a vessel which temporarily stores the coolant with gas having a partial oxygen pressure of almost 0. The temperature adjustment unit has a function of suppressing an increase in a dissolved oxygen amount of the coolant within the exposure apparatus. The increase in the dissolved oxygen amount of the coolant is suppressed by filling a vessel which temporarily stores the coolant in said temperature adjustment unit with inert gas, or blowing inert gas into the coolant in the vessel.

Since the exposure apparatus with the above arrangement comprises the deoxidation unit which performs deoxidation processing for the coolant, the rust prevention effect in the apparatus can be obtained without adding any contaminant which is unpreferable to a manufacturing process in a semiconductor factory. The coolant preservation effect can also be expected, and the sterilization unit can be downsized. When the coolant is distilled or pure water, a contaminant which is unpreferable to the manufacturing process in the semiconductor factory can be completely eliminated, and the rust prevention effect can be enhanced. Moreover, the preservation effect can be expected, and the entire apparatus can be greatly downsized.

The temperature adjustment unit suppresses an increase in the dissolved oxygen amount of the coolant in the exposure apparatus. For example, the increase in the dissolved oxygen amount of the coolant is suppressed by filling a vessel which temporarily stores the coolant in the temperature adjustment unit with inert gas, or blowing inert gas into the coolant. The effect of deoxidation processing by the deoxidation unit can be maintained, increasing the processability of the deoxidation unit and downsizing the apparatus.

Since the exposure apparatus comprises the UV sterilization unit which performs UV sterilization processing for the coolant, the coolant preservation effect can be obtained without adding any contaminant which is unpreferable to the manufacturing process in the semiconductor factory. Deoxidation processing for the coolant can provide a greater preservation effect. When the coolant is distilled or pure water, the preservation effect can be further enhanced.

It is preferable that the control unit comprise a channel which flows the coolant at the predetermined temperature, a supply pipe which supplies a coolant generated by the coolant generation device to the channel, and an exhaust pipe which exhausts the coolant outside the channel, and that the control unit circulate the coolant through a stage driving unit for relatively moving one or both of the master and the substrate to align them, thereby cooling the stage driving unit.

It is preferable that the exposure apparatus further comprise a quality detection unit which detects the quality of the coolant, and that a supply amount of the coolant be controlled on the basis of a detection result of the quality detection unit.

The present invention can also be applied to a semiconductor device manufacturing method comprising the steps of installing manufacturing apparatuses for performing various processes, including any one of the exposure apparatuses, in a semiconductor manufacturing factory, and manufacturing a semiconductor device by performing a plurality of processes using the manufacturing apparatuses. The method preferably further comprises the steps of connecting the manufacturing apparatuses by a local area network, and communicating information about at least one of the manufacturing apparatuses between the local area network and an external network outside the semiconductor manufacturing factory. It is preferable that a database provided by a vendor or user of the exposure apparatus be accessed via the external network to obtain maintenance information of the manufacturing apparatus by data communication, or that data communication be performed between the semiconductor manufacturing via the external network to perform production management.

The present invention can also be applied to a semiconductor manufacturing factory comprising manufacturing apparatuses for performing various processes, including any one of the exposure apparatuses, a local area network which connects the manufacturing apparatuses, and a gateway which allows the local area network to access an external network outside the factory, wherein information about at least one of the manufacturing apparatuses can be communicated.

According to the present invention, there may also be provided a maintenance method for any one of the exposure apparatuses installed in a semiconductor manufacturing factory, characterized by comprising the steps of causing a vendor or user of the exposure apparatus to provide a maintenance database connected to an external network of the semiconductor manufacturing factory, permitting access to the maintenance database from the semiconductor manufacturing factory via the external network, and transmitting maintenance information accumulated in the maintenance database to the semiconductor manufacturing factory via the external network.

The present invention may also be characterized in that any one of the exposure apparatuses further comprises a display, a network interface, and a computer which executes network software, and maintenance information of the exposure apparatus can be communicated via a computer network. It is preferable that the network software provide on the display a user interface for accessing a maintenance database which is provided by a vendor or user of the exposure apparatus and connected to the external network of a factory where the exposure apparatus is installed, and enable obtaining information from the database via the external network.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 12 is a particular example of a user interface;

DETAILED DESCRIPTION OF THE PREFERRED EMBODIMENTS

<First Embodiment>

Figure 1:
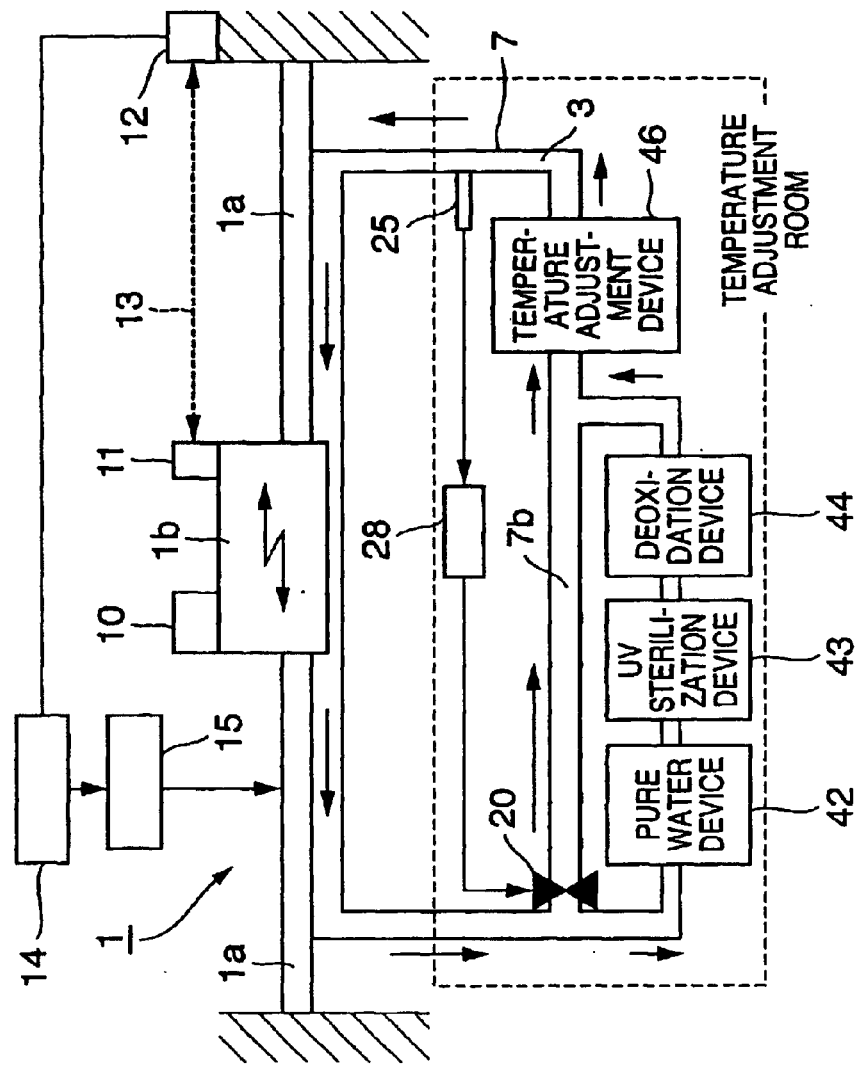
FIG. 1 is a view showing the cooling system of an exposure apparatus according to the first embodiment of the present invention.
Figure 8:
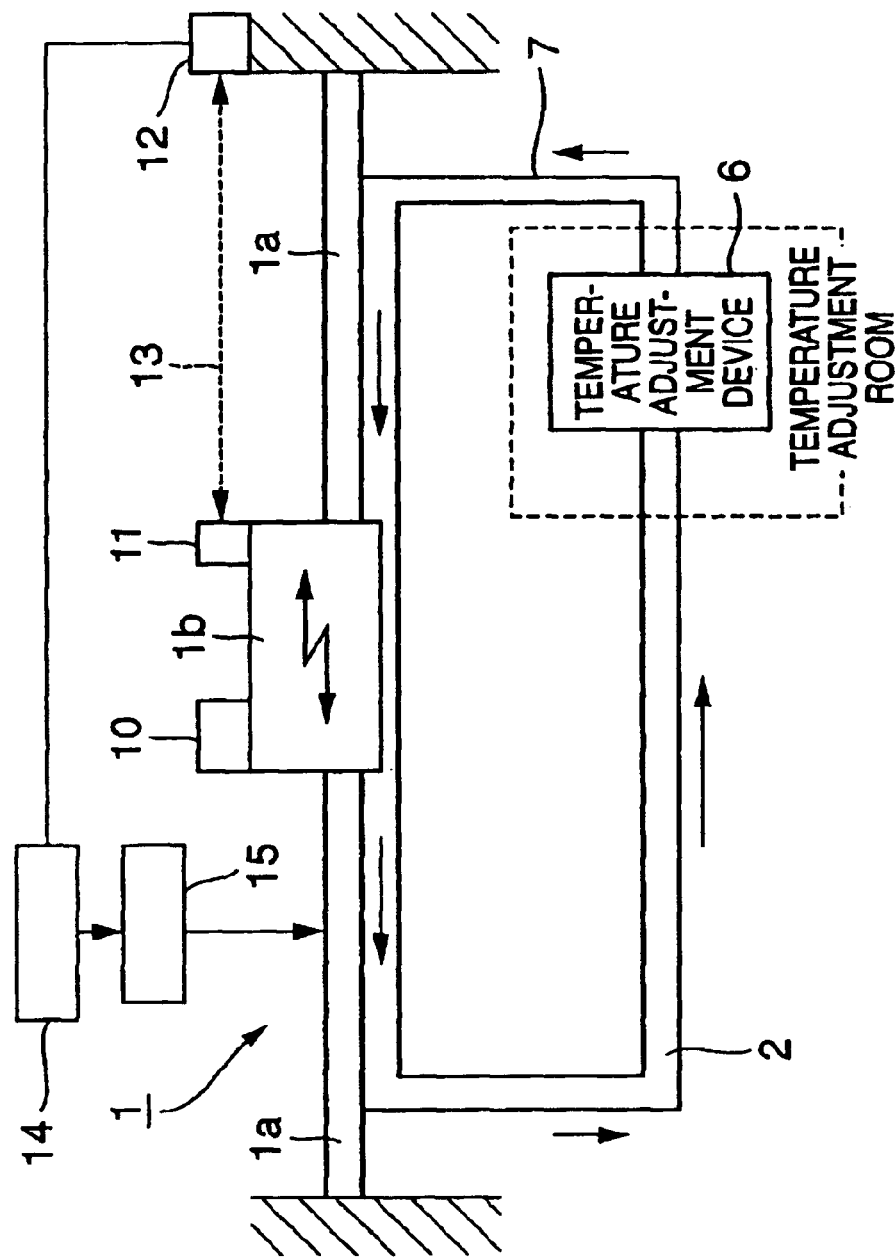
FIG. 8 is a view showing a conventional cooling system.

FIG. 1 is a view showing an example of a cooling system according to the first embodiment of the present invention. The same reference numerals as in FIG. 8 denote the same parts. This embodiment exemplifies the cooling arrangement of an alignment device in an exposure apparatus in correspondence with the prior art shown in FIG. 8. In the prior art, a fluorine-based inert coolant is circulated between a driving unit and a temperature adjustment device. In the first embodiment, pure water 3 having undergone one or both of sterilization processing by a UV (Ultraviolet) sterilization device 43 and deoxidation processing by a deoxidation device 44 is used as a coolant and circulated through a closed space. A pure water device 42 and the UV sterilization device 43 are inserted in the channel of the circulating pure water 3 in addition to the deoxidation device 44 and a temperature adjustment device 46. A bypass valve 20 is inserted in a bypass-side channel 7b, whereas a water quality sensor 25 is inserted in a channel 7 on the exit side of the temperature adjustment device 46. The deoxidation device 44 is mainly formed from a deaeration device. In general, the deaeration device deaerates gas dissolved in a coolant to the low-partial-pressure vacuum side through a vacuum deaeration film. This can decrease the dissolved concentrations of almost all gases in addition to oxygen dissolved in the coolant.

The water quality sensor 25 detects the purity, oxygen concentration, and the like. The purity is detected by measuring the conductivity of pure water. When the water quality reaches a predetermined level or less, a valve controller 28 controls the opening degree of the bypass valve 20 on the basis of the water quality detection result of the water quality sensor 25. Accordingly, the valve controller 28 controls the flow rate of pure water flowing through the pure water device 42, UV sterilization device 43, and deoxidation device 44. The valve controller 28 also comprises an error output function of stopping the whole apparatus depending on the water quality.

Figure 4:
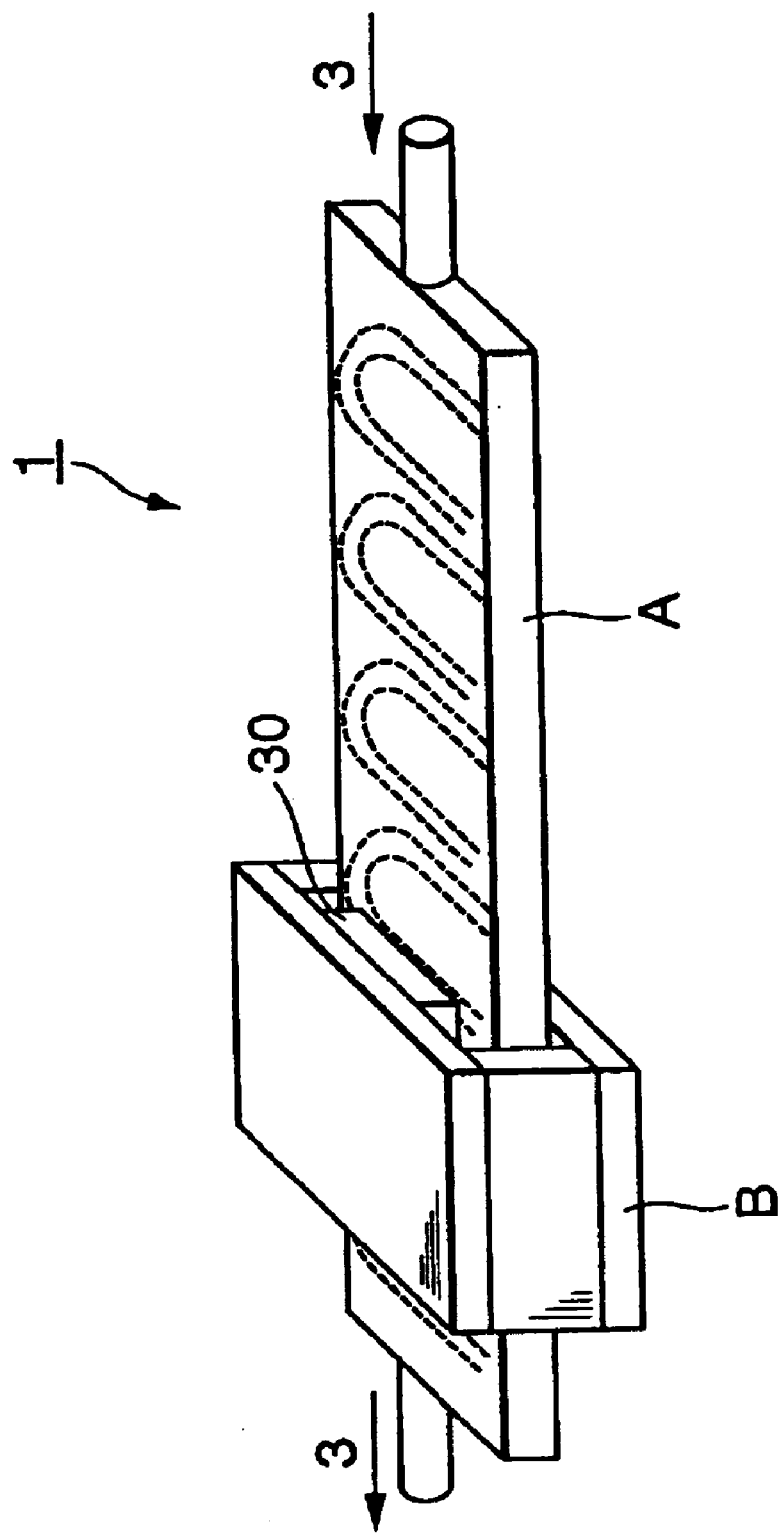
FIG. 4 is a perspective view showing an example of a linear motor as a driving unit used in the exposure apparatus according to the present invention.
Figure 5:
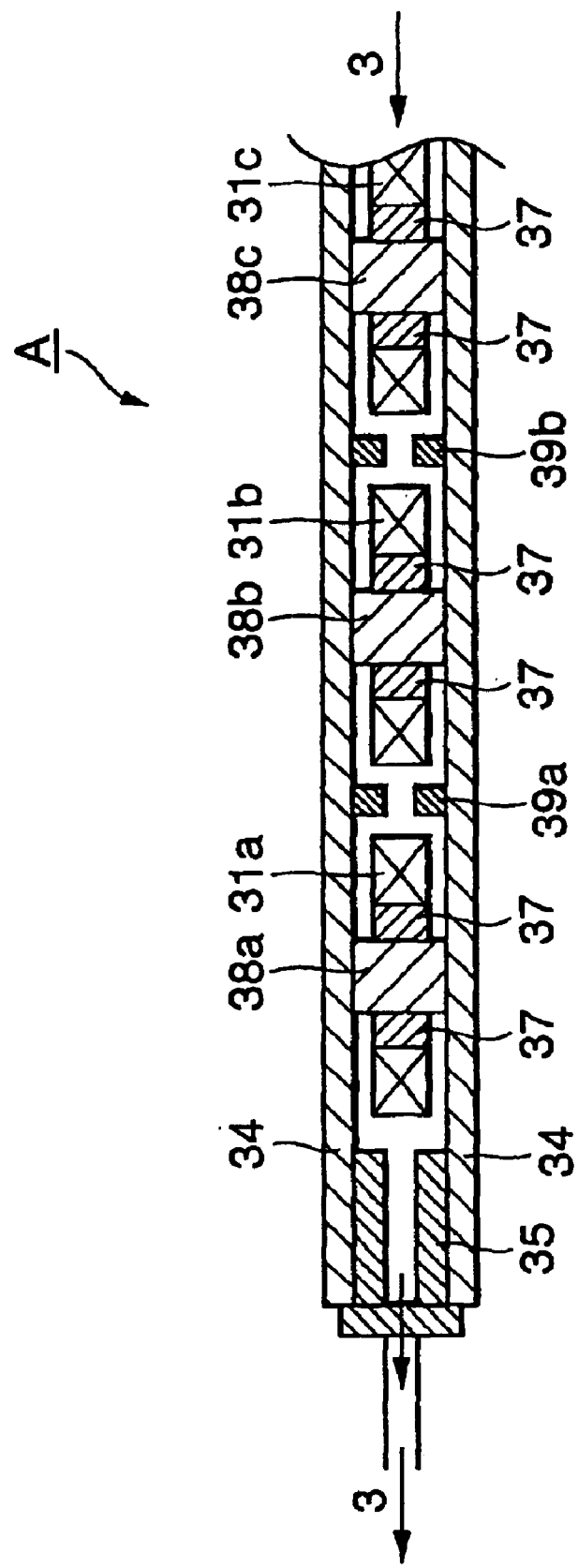
FIG. 5 is a sectional view showing the stator of the linear motor in FIG. 4.

FIG. 4 is a perspective view showing a linear motor as an example of the driving unit, and FIG. 5 is a sectional view showing the stator of the linear motor. A linear motor 1 is made up of a rotor B with a magnet 30, and a stator A with coils 31a, 31b, and 31c serving as heating elements. As shown in FIG. 5, the stator A incorporates the coils 31a, 31b, and 31c, and has a jacket structure with a jacket 34 which surrounds them. A member 35, members 39a and 39b, and the like for efficiently bringing the pure water 3 into contact with the coils 31a, 31b, and the like are fixed to the inner surface of the jacket 34. The pure water 3 directly contacts the coils 31a, 31b, and 31c supported by support members 38a, 38b, and 38c via members 37, and efficiently deprives the coils of heat generated by them.

Figure 6:
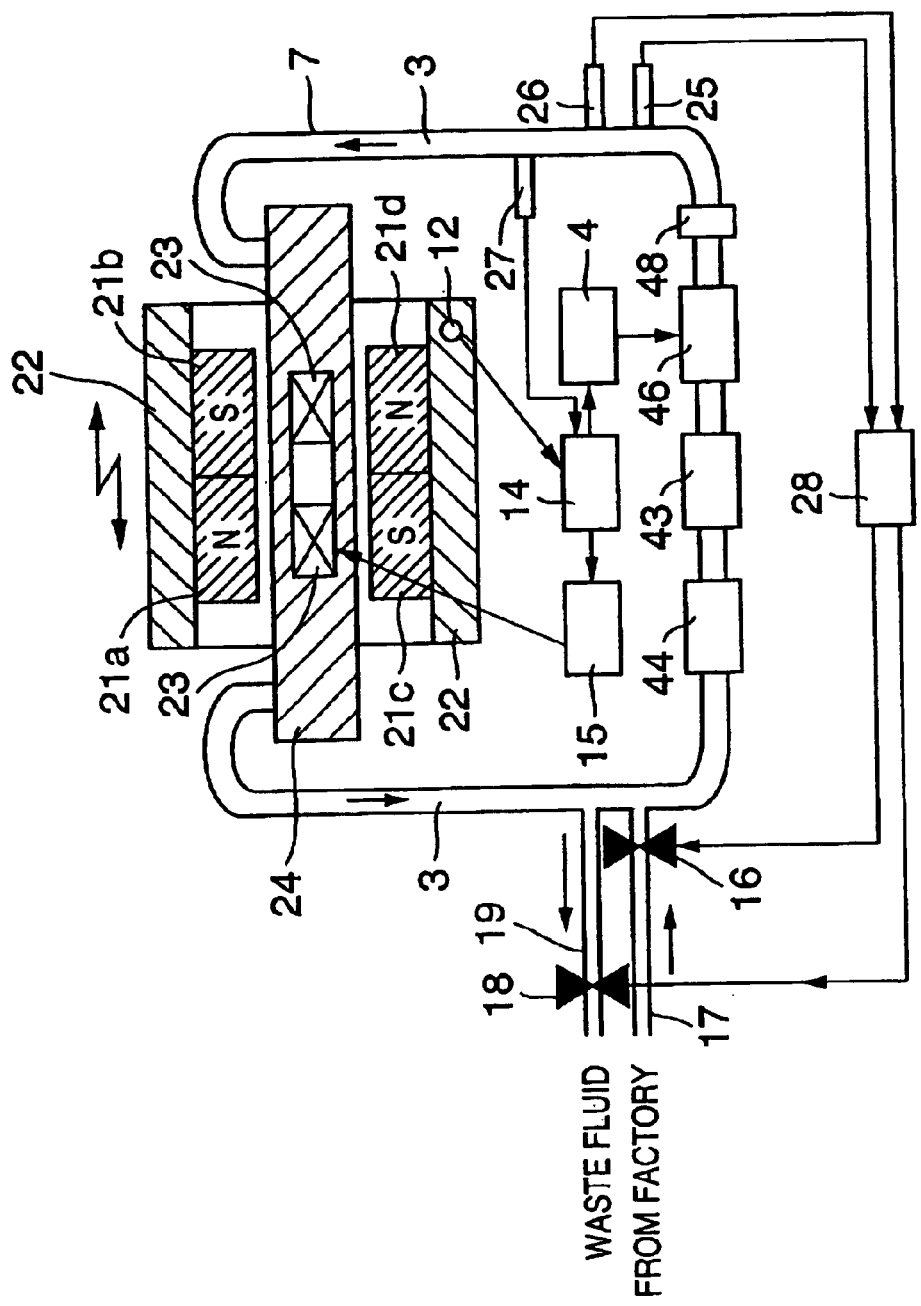
FIG. 6 is a view showing an example of the linear motor as the driving unit used in the exposure apparatus according to the present invention, and a cooling system for the linear motor.

Another example of the driving unit is illustrated in FIG. 6. FIG. 6 is a view showing an example of a single-coil linear motor. In this linear motor, permanent magnets 21a, 21b, 21c, and 21d are fixed to the inner surfaces of yokes 22, and face each other. A coil 23 is supported in a coil support 24 between the permanent magnets 21a and 21b and the permanent magnets 21c and 21d. In this linear motor, similar to the linear motor shown in FIGS. 4 and 5, the pure water 3 as a coolant is supplied into the coil support 24, directly contacts the coil 23, and radiates heat generated by the coil 23. A flow rate sensor 26, temperature sensor 27, and filter 48 are inserted in the channel 7 in addition to the water quality sensor 25.

Outputs from the water quality sensor 25 and flow rate sensor 26 are sent to the valve controller 28, which controls opening/closing of supply and exhaust valves 16 and 18 and controls the water quality and flow rate of the circulating pure water 3. An output from the temperature sensor 27 is sent to a controller 14, which controls the temperature adjustment device 46 via a cooling control means 4 and controls the temperature or flow rate of the pure water 3. The flow rate sensor 26, temperature sensor 27, and filter 48 can also be applied to the first embodiment shown in FIG. 1.

It is generally known that deoxidation processing performed for a coolant by a deoxidation device prevents rust of metal in contact with the coolant. From the reaction formula describing rusting of a metal:

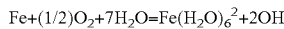

$$Fe + (1/2)O_2 + 7H_2O = Fe(H_2O)_6^{2} + 2OH$$

necessary conditions of rusting metal are the following three: ① water exists on the surface of iron, ② oxygen is dissolved in water, and ③ ionization of iron and reduction of oxygen in an electrically equal part to it occur simultaneously. This also applies to other metals. Hence, when water is used as a coolant, removal of oxygen dissolved in water can prevent formation of any rust in principle. As for ③, if a strong electrolytic salt such as NaCl is dissolved in a coolant, the salt mediates ionization. In this case, ionization of iron (rust of iron) need not occur at the same time as ionization of oxygen, which eliminates any conditional restrictions. Hence, rust can be suppressed much more than in a usual state by removing an electrolytic salt in a coolant. It is also known that chloride ions or sulfate ions are related to the growth of rust. In terms of rust prevention, distilled water from which any electrolytic salt is removed or pure water having passed through an ion-exchange filter or the like is preferable.

As a method of sterilizing a coolant, a simple method of adding a preservative to the coolant is generally employed and it has a great effect. However, the use of this method in the exposure apparatus poses a problem due to the following reasons.

1. The preservative often contains a component undesirable to a manufacturing process in a semiconductor factory.
2. If pure water is used to give a coolant an insulating property, the insulating property is degraded by an additive such as a preservative.
3. In order to maintain the sterilization effect, a sample must be periodically checked, increasing the maintenance burden.

For these reasons, the exposure apparatus adopts, as a sterilization method, sterilization by a so-called UV sterilization device which sterilizes a coolant by ultraviolet radiation. No additive needs to be added to the coolant, and the process in the semiconductor factory is not adversely affected. Especially when pure water is used to ensure an insulating property in a coolant, like the first embodiment, the coolant can be sterilized without degrading the insulating property of pure water (resistivity of pure water) by addition to pure water. In the use of the UV sterilization device, maintenance suffices to be performed at the apparatus level (exchange of an ultraviolet lamp or the like) The maintenance cycle and method are clear, thus reducing the maintenance burden.

With the use of pure water as a coolant, a contaminant undesirable in the semiconductor factory can be recovered within the pure water device. Even if the coolant leaks outside the apparatus, contamination of the semiconductor factory can be prevented. If contaminants are at a negligible level for the factory, but the coolant leaking from a pipe or the like attaches to a precision surface plate or the like, the coolant volatilizes to leave the additive component on the surface of the precision surface plate. The additive component may influence the surface precision of the surface plate. However, distilled or pure water used as a coolant does not leave any residue even if the coolant leaks and volatilizes in the apparatus. Hence, the coolant does not influence the precision of the surface plate.

The rust prevention effect is given by deoxidation processing in consideration of contamination of a coolant in the use of a generally used rust preventive. Rust preventives are roughly classified into two types: rust preventives containing metal salts and rust preventives containing amine-based salts. These salts are, however, unpreferable in the manufacturing process in the semiconductor factory, as described above. For example, deposition of a metal salt on a wafer decreases the yield. An amine-based salt adversely affects a resist. Since a coolant circulates through a closed system, no problem arises unless an accident such as leakage of the coolant occurs. In consideration of an emergency, sometimes it is not preferred to add such a contaminant for the rust prevention effect in terms of the reliability of the apparatus. Since the coolant is distilled or pure water from which an organic matter as a feed of bacteria in the coolant is removed, breeding of bacteria can be suppressed to a certain degree. In addition, performing deoxidation processing for the coolant is very effective for bacteria which require oxygen to live. As a result, any device for sterilization processing or the like can be omitted or the apparatus can be downsized.

As for the maintenance, deoxidation processing has a merit in comparison with a method using an additive. In many cases, the exposure apparatus operates for twenty-four hours, and it is desirable in terms of the reliability to constantly check whether the rust prevention effect has been maintained. The method using deoxidation processing can check the system by using a general measurement device such as a dissolved oxygen analyzer. The method using an additive generally requires a periodic sample check, which increases the maintenance burden.

For this reason, UV sterilization processing is done to remove dissolved oxygen, and distilled or pure water free from any contaminant is circulated. This is very suitable for cooling in the exposure apparatus which operates in the semiconductor factory. In this case, the gist of the present invention can be achieved without particularly arranging the pure water device 42 as far as the coolant channel is satisfactorily cleaned and distilled or pure water free from any contaminant is used from the beginning.

Figure 7:
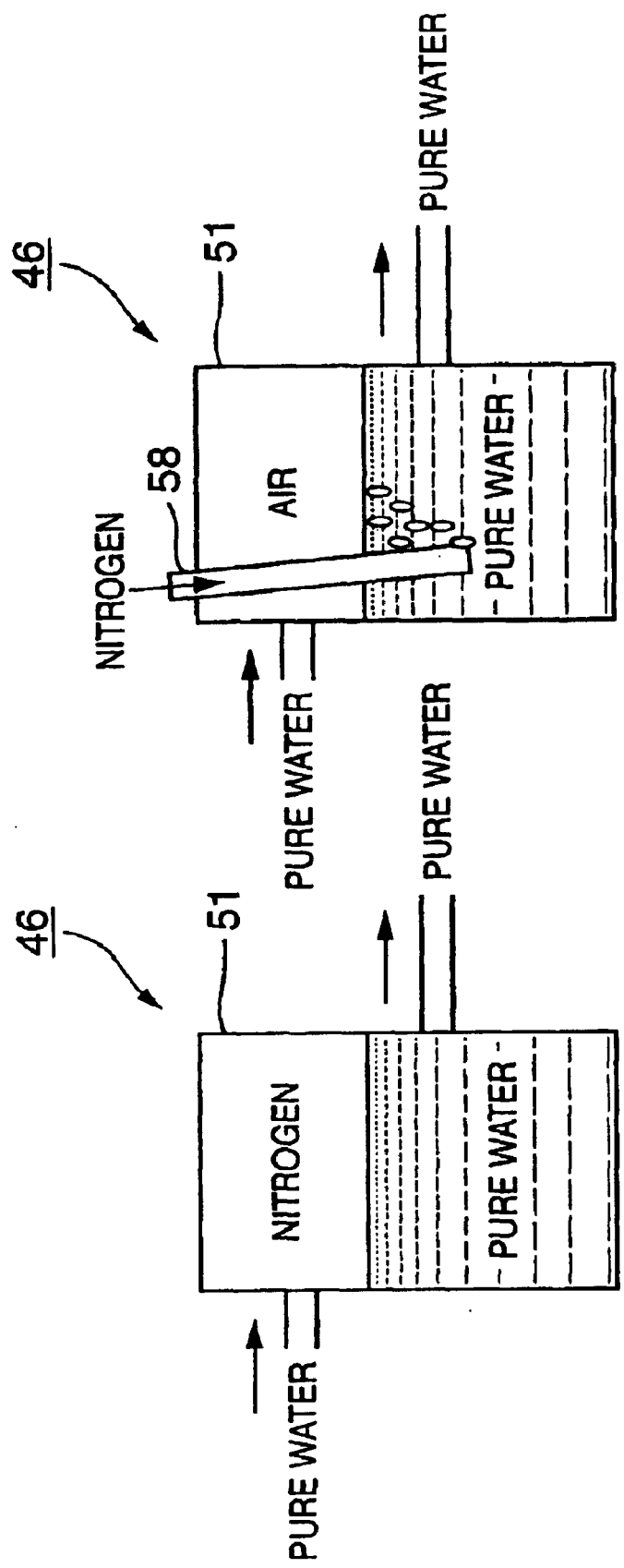
FIGS. 7A and 7B are views schematically showing a temperature adjustment device according to the embodiment of the present invention.

If the coolant contacts oxygen after deoxidation processing by the deoxidation device 44, the coolant dissolves in oxygen to increase the dissolved oxygen amount even upon deoxidation processing. Many general temperature adjustment devices comprise vessels for storing a predetermined amount of coolant in order to maintain the temperature at high precision. At this portion, a port for supplying or exhausting the coolant is often connected, and the coolant generally contacts air. In a conventional temperature adjustment device, oxygen in air within the vessel undesirably dissolves in the coolant. In the temperature adjustment device 46 according to the present invention, as shown in FIG. 7A, a gas space within a vessel 51 is purged with nitrogen to prevent the coolant from contacting oxygen. Instead of purging the space within the vessel 51, as shown in FIG. 7B, nitrogen may be forcibly blown and dissolved in the coolant in the vessel 51 via a blow pipe 52, and the partial pressure of the coolant with respect to gas may be increased to inhibit dissolution of oxygen. The gist of the present invention can also be achieved by not forming any gas space within the vessel 51, or by devising the shape of the vessel 51 to decrease a portion which comes into contact with gas. Positively adopting the arrangement in FIG. 7A or 7B will provide the deoxidation processing effect. For example, the contact area is increased such that the coolant in the vessel positively contacts purge gas (made of inert gas which has a partial oxygen pressure of almost 0 and is hard to dissolve in water). Alternatively, the coolant is stirred and bubbled (bubbling) to decrease the amount of oxygen dissolved in the coolant. This is based on the principle that the amount of gas dissolved in liquid is proportional to the partial pressure of contact gas, and that the coolant is brought into contact with gas having a partial oxygen pressure of almost 0 to decrease the amount of oxygen dissolved in the coolant to 0. With this effect, the temperature adjustment device may be controlled to function as a deoxidation device without the mediacy of any deaeration device.

<Second Embodiment>

Figure 2A:
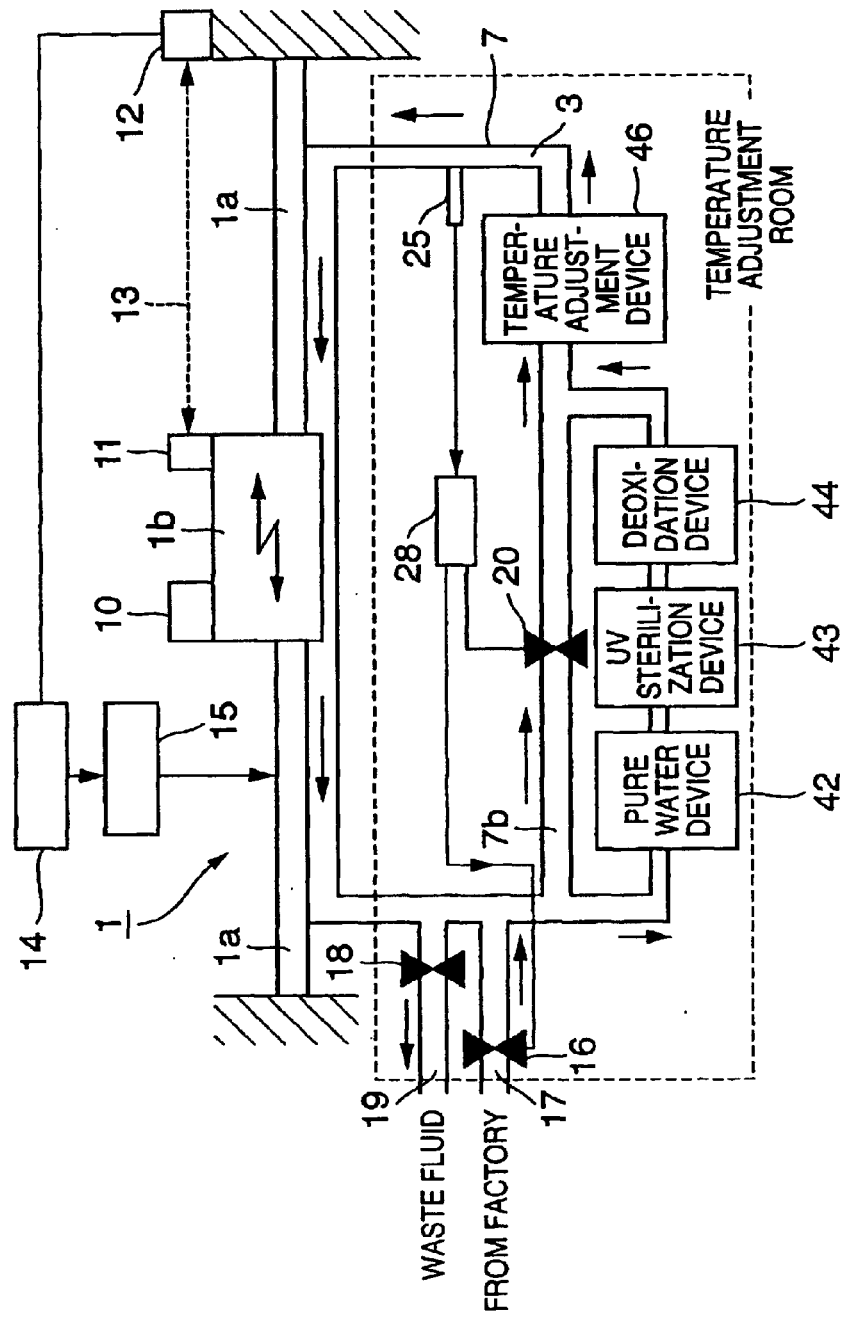
FIG. 2A is a view showing the cooling system of an exposure apparatus according to the second embodiment of the present invention.

FIG. 2A is a view showing an example of a cooling system according to the second embodiment of the present invention. The same reference numerals as in FIG. 1 denote the same parts. In the second embodiment, a supply valve 16 is opened to always slightly supply pure water supplied from a factory via a supply pipe 17, and an exhaust valve 18 is opened to exhaust and exchange circulating pure water 3 via an exhaust pipe 19 in order to maintain the level of the circulating pure water 3, easily suppress degradation (decay) of the pure water 3 or the like, and keep the dissolved oxygen amount at a low level. In general, a semiconductor factory manufactures a large amount of pure water having undergone deoxidation processing at high level (high resistivity) in order to use pure water for wafer cleaning or the like. In the semiconductor factory, therefore, the unit cost of pure water is much lower than that of generally acquired pure water. As one method of maintaining pure water with a small dissolved oxygen amount, a circulating coolant is diluted with a proper amount of pure water with a small dissolved oxygen amount or high level (high resistivity) pure water at a proper timing. In this case, a deoxidation device 44 or pure water device 42 can be greatly downsized or omitted. The factory may always supply a predetermined amount of pure water or may supply a predetermined amount of pure water every predetermined time. Alternatively, the factory may supply pure water after the water quality reaches a given criterion or less. In any case, the gist of the present invention can be achieved. When the factory supplies a predetermined amount of high-level pure water every time, every predetermined time, or after the water quality reaches a predetermined criterion or less, decay of pure water can also be prevented. As a result, a means for preventing decay (e.g., adding a preservative or using a sterilization device such as a UV filter) can be omitted or downsized.

To supply high-level pure water from the factory when the water quality reaches a predetermined criterion or less, the flow rate of pure water supplied from the factory can be controlled by controlling the opening degree of a flow rate sensor 26 by a valve controller 28 on the basis of the water quality detection result of a water quality sensor 25 which detects the water quality in a channel 7. The water quality sensor 25 detects the purity, oxygen concentration, and the like. The purity is detected by measuring the conductivity of pure water. The second embodiment adopts a bypass valve 20 which opens/closes a bypass-side channel 7b which does not pass through the deoxidation device 44. The flow rate of pure water flowing through the pure water device 42, UV sterilization device 43, and deoxidation device 44 can also be controlled by controlling the bypass valve 20 by the valve controller 28 on the basis of the water quality detection result of the water quality sensor 25. In this embodiment, similar to the arrangement shown in FIG. 6, a flow rate sensor 26, temperature sensor 27, and filter 48 may be inserted in the channel 7 in addition to the water quality sensor 25.

<Third Embodiment>

Figure 2B:
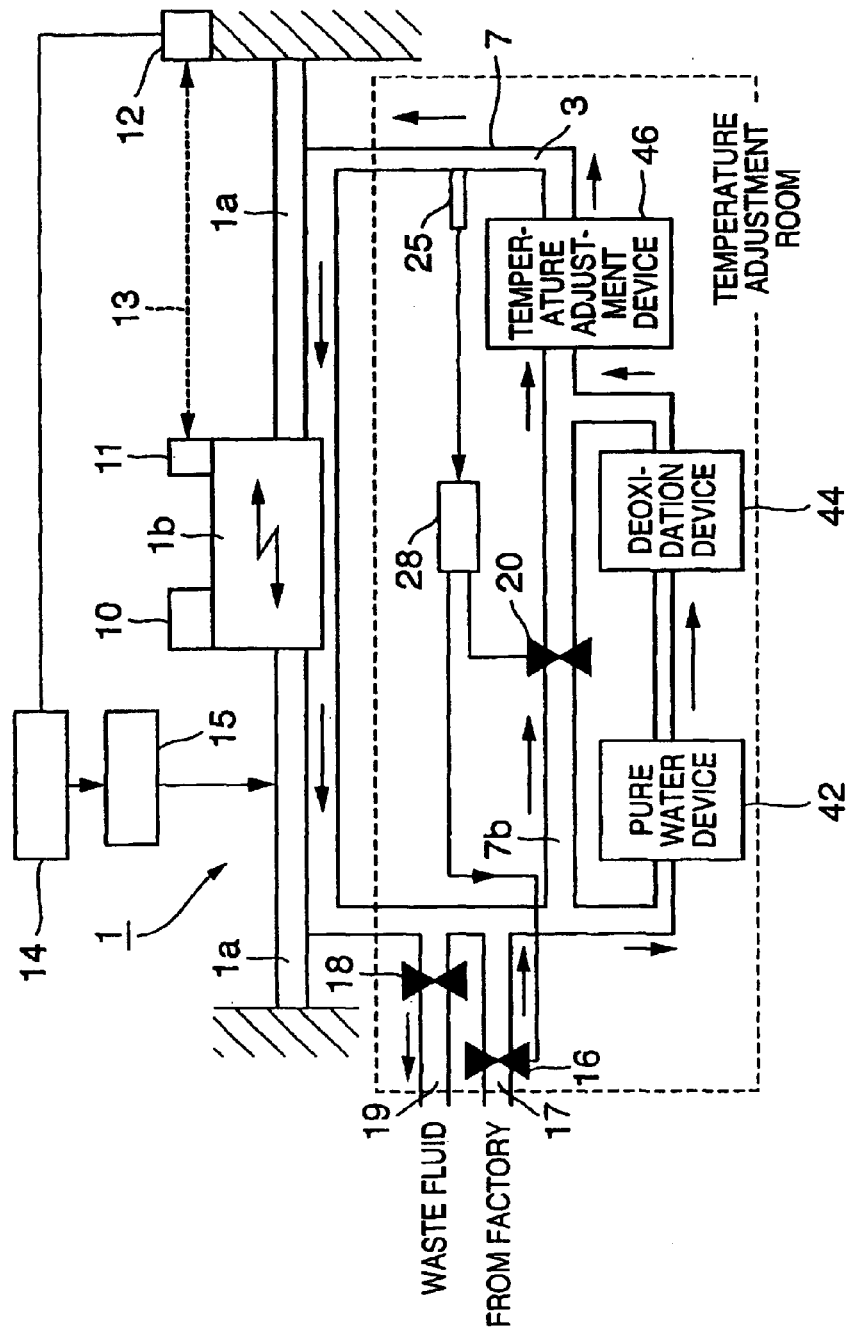
FIG. 2B is a view showing the cooling system of an exposure apparatus according to the third embodiment of the present invention.

FIG. 2B is a view showing an example of a cooling system according to the third embodiment of the present invention. In FIG. 2B, the same reference numerals as in FIG. 8 denote the same parts.

Implementation of the cooling systems shown in the structural views of FIGS. 1 and 2A requires a large-size pure water device 42, UV sterilization device (UV filter) 43, and deoxidation device 44 in order to maintain the water quality of circulating pure water. The results of further examination revealed that simply circulating pure water in the arrangement as shown in FIG. 1 or 2A requires an apparatus almost twice as large as a conventional one. In order to minimize the sizes of various devices which maintain the water quality of pure water used for temperature adjustment, pure water is supplied from a semiconductor factory which has large amounts of high-level pure water and deaerated pure water, thereby downsizing the apparatus. That is, the use of pure water with high water quality can decrease the burden on various devices and downsize them. FIG. 2B shows this arrangement.

In the cooling system shown in FIG. 2B, a supply valve 16 is opened to always slightly supply pure water supplied from a factory via a supply pipe 17, and an exhaust valve 18 is opened to exhaust and exchange circulating pure water 3 via an exhaust pipe 19 in order to maintain the resistivity of the circulating pure water 3 and easily suppress degradation (decay) of pure water 3 or the like. In general, a semiconductor factory manufactures a large amount of high-level (high-resistivity) pure water in order to use pure water for cleaning of a wafer serving as a substrate. At the same time, the semiconductor factory manufactures a large amount of pure water from which dissolved oxygen is reduced by the deoxidatiori device 44 in order to prevent formation of any oxide film on a wafer. In the semiconductor factory, the unit cost of pure water (deacrated pure water) is much lower than that of generally acquired pure water. As one method of maintaining pure water, a circulating pure water coolant is diluted with a proper amount of high-level (high-resistivity) pure water at a proper timing. In the cooling system of FIG. 2B, the pure water device 42 can be made much more compact than those in the arrangements of FIGS. 1 and 2A, or can also be omitted. If pure water supplied from the factory is deaerated pure water, the deaeration (deoxidation) device 44 in the exposure apparatus can be greatly downsized or omitted. The factory may supply a predetermined amount of pure water every time, every predetermined time, or after the water quality of circulating pure water reaches a predetermined critenon or less.

Moreover, decay of pure water can also be prevented when the factory supplies a predetermined amount of high-level pure water every time, every predetermined time, or after the water quality detected by a water quality sensor 25, which is connected to the exit of a temperature adjustment 46 and detects the water quality in a channel 7, reaches a predetermined criterion or less. A means for preventing decay (e.g., adding a preservative or using a sterilization device such as a UV sterilization device 43) can be omitted or downsized.

The third embodiment also employs a bypass valve 20 which opens/closes a bypass-side channel 7b which does not pass through the pure water device 42. A valve controller 28 controls the bypass valve 20 on the basis of the water quality detection result of the water quality sensor 25. The valve controller 28 can, therefore, control the flow rate of pure water flowing through the pure water device 42 and deoxidation device 44. The water quality sensor 25 detects the purity, oxygen concentration, and the like. The purity is detected by measuring the conductivity of pure water. When the factory supplies high-level pure water after the water quality of circulating pure water reaches a predetermined criterion or less, the valve controller 28 can also control the flow rate of pure water supplied from the factory by controlling the opening degree of the supply valve 16 on the basis of the water quality detection result of the water quality sensor 25.

In general, when pure water is circulated, the resistivity gradually decreases due to ions eluted from a material which forms a coolant channel such as a pipe. A wire which forms a coil is prepared by covering a copper wire with an insulating layer of polyimide or the like. The JIS (Japanese Industrial Standard) standard recognizes the presence of so-called pinholes on the copper wire that are small holes not covered with the insulating layer. This means that a short circuit may occur between these pinholes via a coolant for a low coolant resistivity. Even at a portion coated with the insulating layer, the dielectric breakdown voltage of the wire depends on the material (air or a coolant) in contact with the wire. From this, the dielectric breakdown voltage can be kept high when the coolant is air or an inert coolant with a high insulating property, but becomes low when the insulating property, i.e., resistivity of the coolant is low. In an arrangement in which the coolant directly contacts the coil, the resistivity of the coolant must be maintained at a predetermined value or more. In order to maintain the resistivity of a pure water coolant at a predetermined value or more, the third embodiment adopts the pure water device 42 which can ensure the resistivity for a long term. By arranging the pure water device for the coil, even a contaminant unwanted in the semiconductor factory can be recovered within the pure water device. In case of coolant leakage, contamination of the semiconductor factory can be prevented.

In this embodiment, only part of circulating pure water flows through the pure water device. The flow rate of pure water which flows through the pure water device is determined in accordance with the level (resistivity) of pure water and the processability of the pure water device. Depending on the arrangement, all of pure water may flow through the pure water device.

<Fourth Embodiment>

Figure 3:
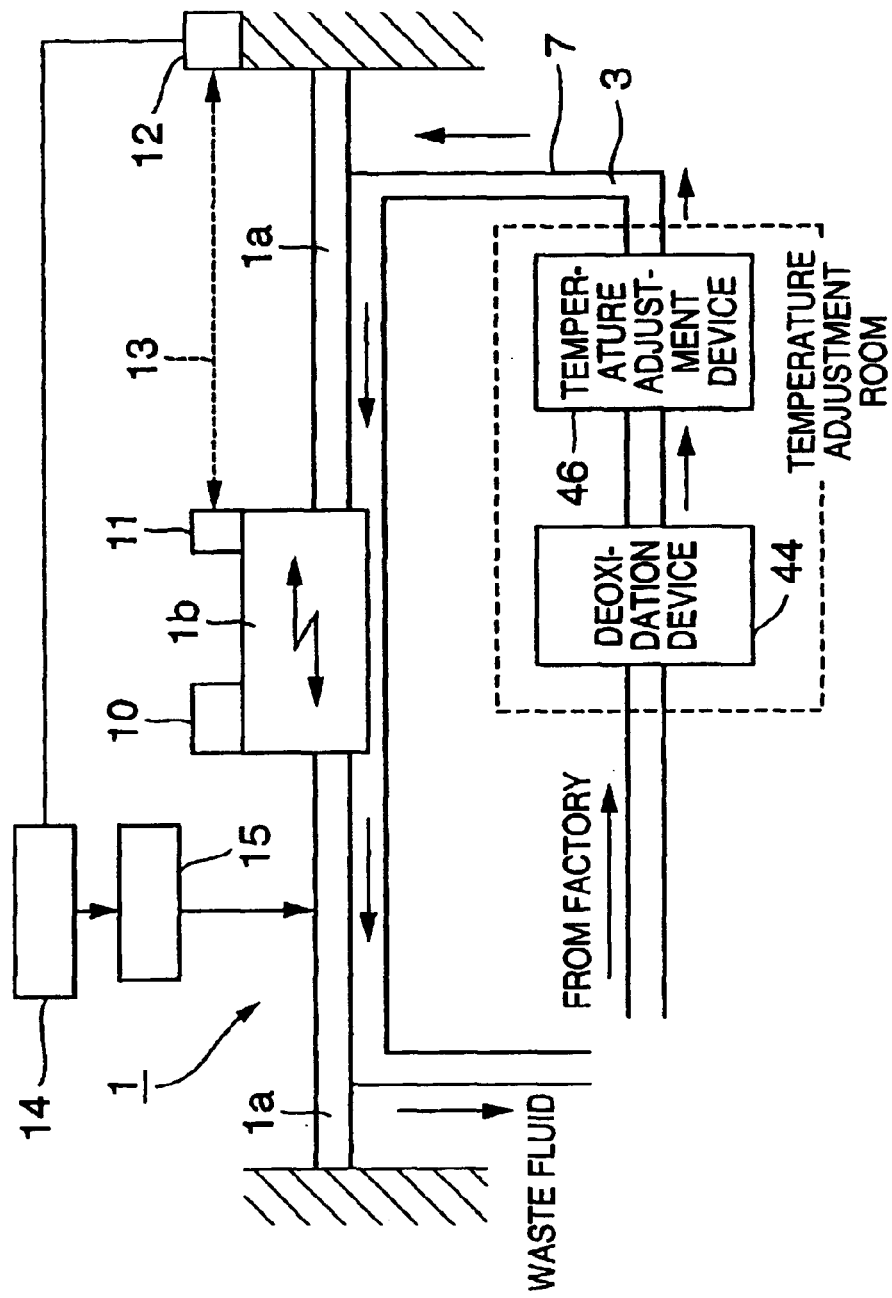
FIG. 3 is a view showing the cooling system of an exposure apparatus according to the fourth embodiment of the present invention.

FIG. 3 is a view showing an example of a cooling system according to the fourth embodiment of the present invention. The third embodiment is an improvement of the second embodiment. All of pure water with a small dissolved oxygen amount is supplied from a factory, and this coolant undergoes temperature adjustment. Pure water 3 is supplied to an object subjected to temperature adjustment to recover generated heat. The pure water 3 is returned as waste water to the factory or reused as low-level pure water. In this case, pure water at a predetermined criterion or more is supplied from the factory. A deoxidation device 44 and pure water device can be omitted or greatly downsized. If pure water supplied from the factory is deacrated (deoxidized) pure water, the deoxidation device 44 in the exposure apparatus can be omitted or greatly downsized. Similar to the second embodiment, no attention needs to be paid to degradation (decay) of the coolant, and thus a means for preventing decay can be omitted or further downsized. Accordingly, the overall exposure apparatus can become very compact.

<Fifth Embodiment>

Figure 9:
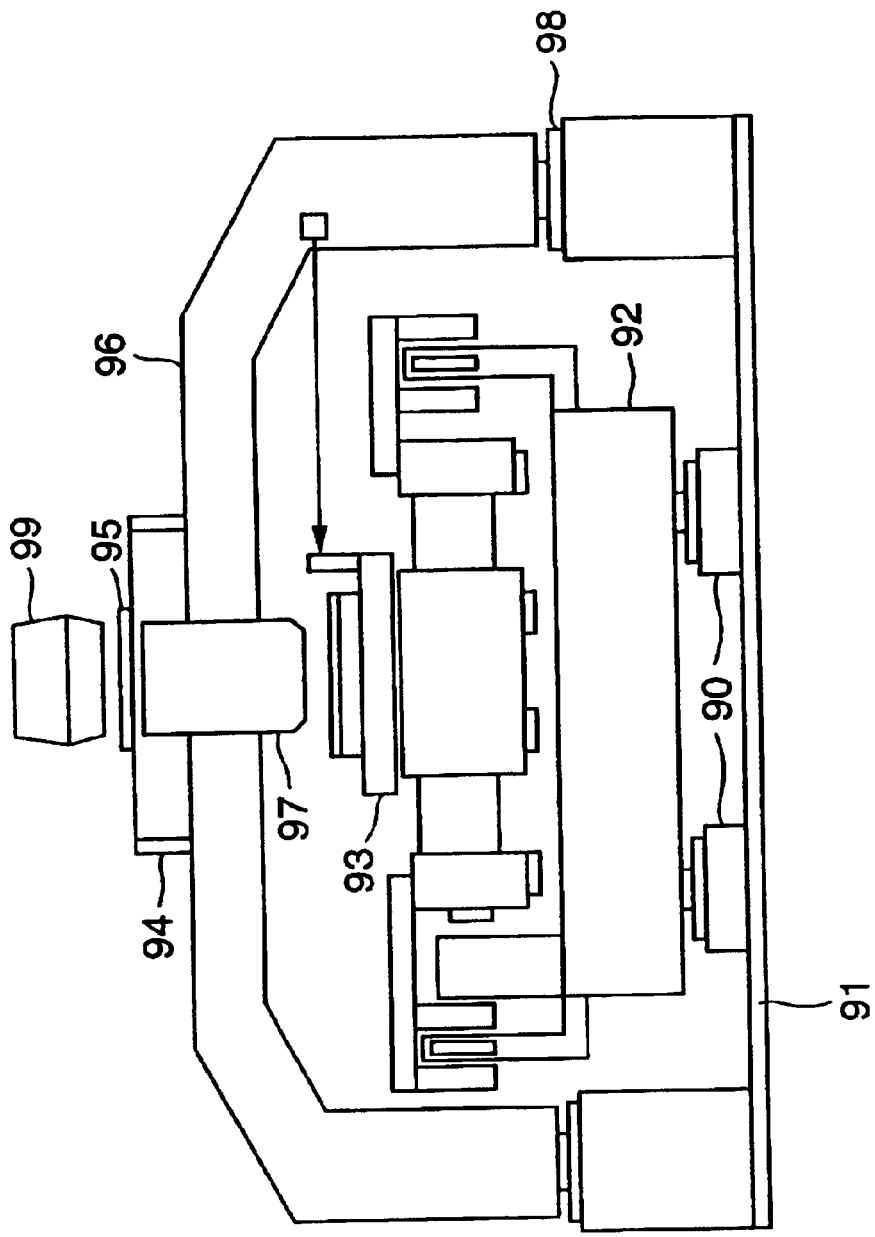
FIG. 9 is a front view showing an exposure apparatus according to the fifth embodiment of the present invention.

The fifth embodiment of the present invention will be described by exemplifying a scanning exposure apparatus. FIG. 9 is a front view showing the main structure of the scanning exposure apparatus according to the fifth embodiment of the present invention. In FIG. 9, a lens barrel surface plate 96 is supported on a floor or base 91 via a damper 98. The lens barrel surface plate 96 supports a reticle stage surface plate 94, and a projection optical system 97 interposed between a reticle stage 95 and a wafer stage 93.

The wafer stage 93 is supported on a stage surface plate 92 supported on the floor or base 91 via a plurality of mounts 90. The wafer stage 93 supports a wafer serving as a substrate, holds it by a chuck (not shown), and aligns it. The reticle stage 95 is supported on the reticle stage surface plate 94 supported on the lens barrel surface plate 96. The reticle stage 95 can move while holding a reticle serving as a master which bears a circuit pattern. Exposure light which transfers the pattern of the reticle on the reticle stage 95 to the wafer on the wafer stage 93 is emitted by an illumination optical system 99.

The wafer stage 93 is scanned in synchronism with the reticle stage 95. During scanning of the reticle stage 95 and wafer stage 93, their positions are continuously detected by interferometers and fed back to the driving units of the reticle stage 95 and wafer stage 93. With this operation, the scanning start positions of the reticle stage 95 and wafer stage 93 can be accurately synchronized, and the scanning speed in a constant-speed scanning region can be controlled at high precision. While the wafer stage 93 and reticle stage 95 are scanned with respect to the projection optical system 97, the wafer is exposed to a reticle pattern, transferring the circuit pattern.

The circulation system of the cooling system according to the present invention can be applied to any fluid of a cooling device for cooling the projection optical system 97, reticle stage 95, wafer stage 93, mount 90, chuck, and the like in the exposure apparatus.

(Embodiment of A Semiconductor Production System)

Next, an example of a semiconductor device (e.g., a semiconductor chip of IC, LSI or the like, a liquid crystal panel, a CCD, a thin film magnetic head, a micromachine, etc.) production system using the apparatus of the present invention will be described. The system performs maintenance services such as trouble shooting, periodical maintenance or software delivery for fabrication apparatuses installed in a semiconductor manufacturing factory, by utilizing a computer network outside the fabrication factory.

Figure 10:
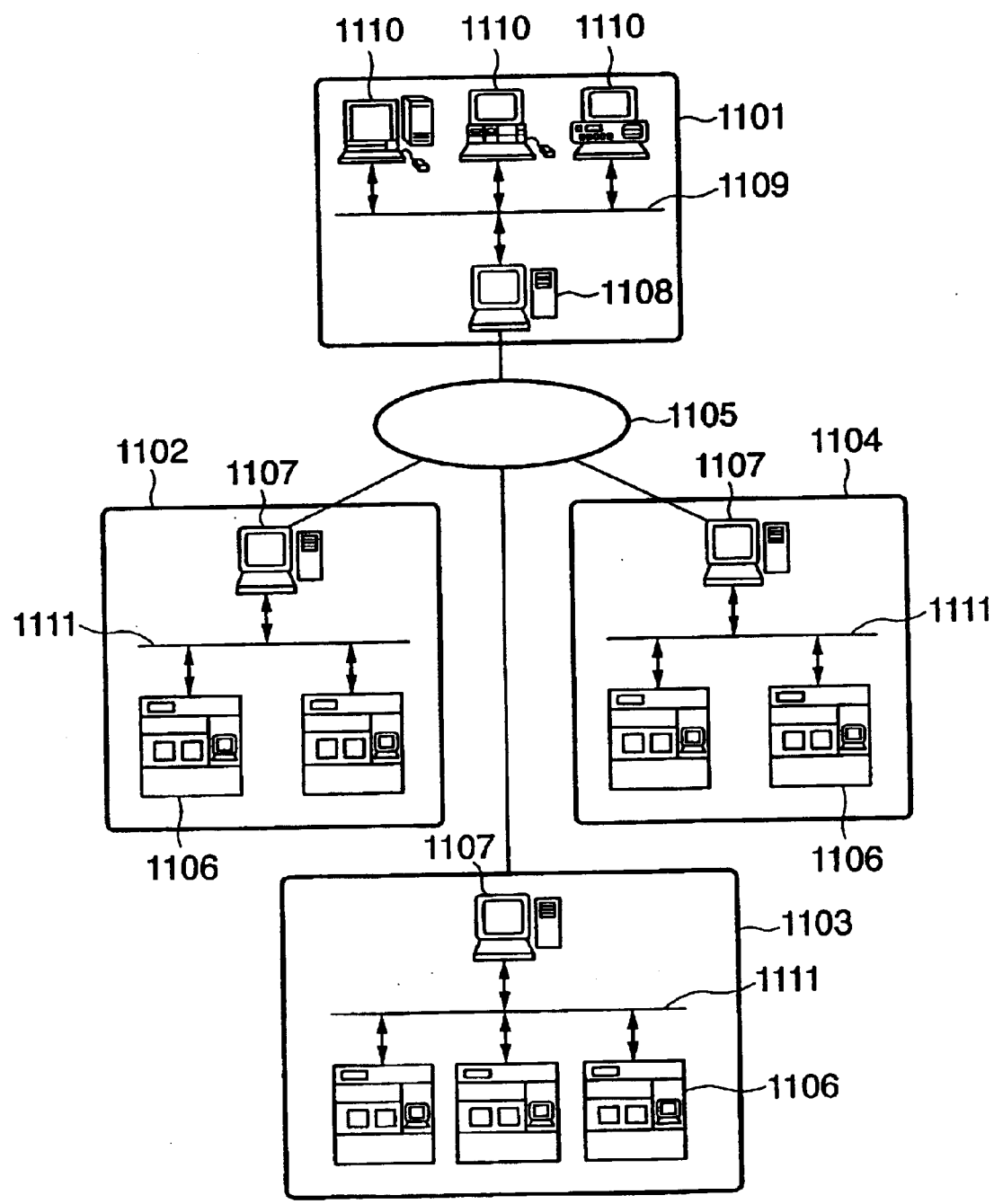
FIG. 10 is a conceptual diagram of a semiconductor device production system using the apparatus according to the embodiment, viewed from an angle.

FIG. 10 shows the entire system cut out from an angle. In the figure, numeral 1101 denotes the office of a vendor (apparatus maker) of semiconductor device fabrication apparatuses. As the semiconductor fabrication apparatuses, apparatuses in the semiconductor fabrication factory for performing various processes such as preprocess apparatuses (e.g., lithography apparatuses including an exposure apparatus, a resist processing apparatus and an etching apparatus, a heat processing apparatus, a film forming apparatus, a smoothing apparatus and the like) and postprocess apparatuses (e.g., an assembly apparatus, an inspection apparatus and the like) are used. The office 1101 has a host maangement system 1108 to provide a maintenance database for the fabrication apparatus, plural operation terminal computers 1110, and a local area network (LAN) 1109 connecting them to construct an Intranet or the like. The host management system 1108 has a gateway for connection between the LAN 1109 and the Internet 1105 as an external network and a security function to limit access from the outside.

On the other band, numerals 1102 to 1104 denote fabrication factories of semiconductor makers as users of the fabrication apparatuses. The fabrication factories 1102 to 1104 may belong to different makers or may belong to the same maker (e.g., preprocess factories and postprocess factories). The respective factories 1102 to 1104 are provided with plural fabrication apparatuses 1106, a local area network (LAN) 1111 connecting the apparatuses to construct an Intranet or the like, and a host management system 1107 as a monitoring apparatus to monitor operating statuses of the respective fabrication apparatuses 1106. The host management system 1007 provided in the respective factories 1102 to 1104 has a gateway for connection between the LAN 1111 and the Internet 1105 as the external network. In this arrangement, the host management system 1108 on the vendor side can be accessed from the LAN 1111 in the respective factories via the Internet 1105, and only limited user(s) can access the system by the security function of the host management system 1008. More particularly, status information indicating the operating statuses of the respective fabrication apparatuses 1106 (e.g., a problem of fabrication apparatus having trouble) is notified from the factory side to the vendor side via the Internet 1105, and maintenance information such as response information to the notification (e.g., information indicating a measure against the trouble, or remedy software or data), latest software, help information and the like is received from the vendor side via the Internet. The data communication between the respective factories 1102 to 1104 and the vendor 1101 and data communication in the LAN 1111 of the respective factories are performed by using a general communication protocol (TCP/IP). Note that as the external network, a private-line network (LSDN or the like) with high security against access from outsiders may be used in place of the Internet.

Further, the host management system is not limited to that provided by the vendor, but a database constructed by the user may be provided on the external network, to provide the plural user factories with access to the database.

Figure 11:
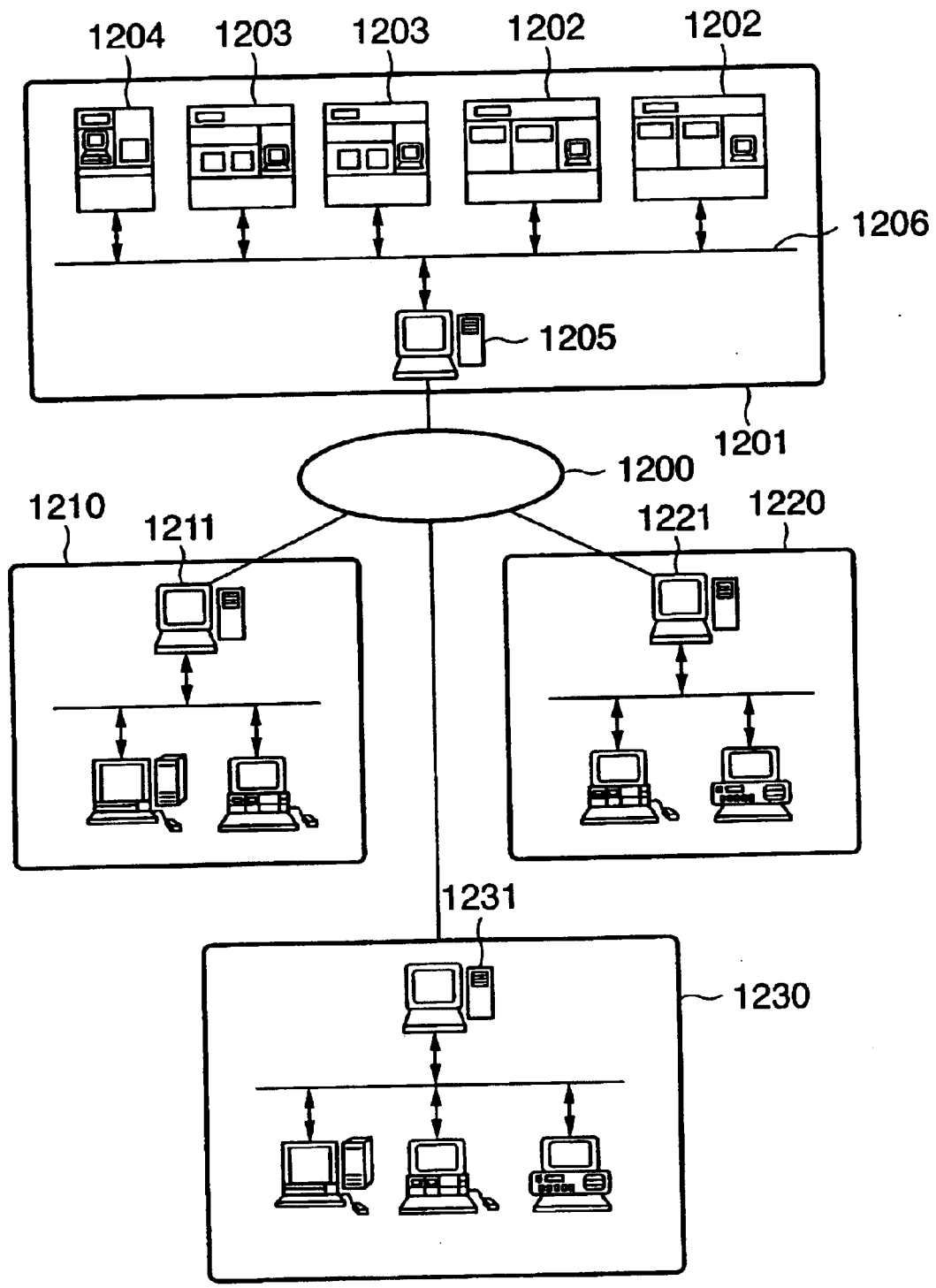
FIG. 11 is a conceptual diagram of the semiconductor device production system using the apparatus according to the embodiment, viewed from another angle.

FIG. 11 is a conceptual diagram showing the entire system of the present embodiment cut out from another angle different from that in FIG. 10. In the above example, the plural user factories respectively having fabrication apparatuses and the management system of the apparatus vendor are connected via the external network, and data communication is performed for production management for the respective factories and transmission of information on at least one fabrication apparatus. In this example, a factory having fabrication apparatuses of plural vendors is connected with management systems of the respective vendors of the fabrication apparatuses via the external network, and data communication is performed for transmission of maintenance information for the respective fabrication apparatuses. In the figure, numeral 1201 denotes a fabrication factory of a fabrication apparatus user (semiconductor device maker). In the factory fabrication line, fabrication apparatuses for performing various processes, an exposure apparatus 1202, a resist processing apparatus 1203 and a film forming apparatus 1204, are used. Note that FIG. 11 shows only the fabrication factory 1201, however, actually plural factories construct the network. The respective apparatuses of the factory are connected with each other by a LAN 1206 to construct an Intranet, and a host management system 1205 performs operation management of the fabrication line.

On the other hand, the respective offices of vendors (apparatus makers), an exposure apparatus maker 1210, a resist processing apparatus maker 1220, a film forming apparatus maker 1230 have host management systems 1211, 1221 and 1231 for remote maintenance for the apparatuses, and as described above, the systems have the maintenance database and the gateway for connection to the external network. The host management system 1205 for management of the respective apparatuses in the user fabrication factory is connected with the respective vendor management systems 1211, 1221 and 1231 via the Internet or private-line network as an external network 1200. In this system, if one of the fabrication apparatuses of the fabrication line has trouble, the operation of the fabrication line is stopped. However, the trouble can be quickly removed by receiving the remote maintenance service from the vendor of the apparatus via the Internet 1200, thus the stoppage of the fabrication line can be minimized.

The respective fabrication apparatuses installed in the semiconductor fabrication factory have a display, a network interface and a computer to execute network access software stored in a memory and device operation software. As a memory, an internal memory, a hard disk or a network file server may be used. The network access software, including a specialized or general web browser, provides a user interface screen image as shown in FIG. 12 on the display. An operator who manages the fabrication apparatuses in the factory checks the screen image and inputs information of the fabrication apparatus, a model 1401, a serial number 1402, a trouble case name 1403, a date of occurrence of trouble 1404, an emergency level 1405, a problem 1406, a remedy 1407 and a progress 1408, into input fields on the screen image. The input information is transmitted to the maintenance database via the Internet, and appropriate maintenance information as a result is returned from the maintenance database and provided on the display. Further, the user interface provided by the web browser realizes hyper link functions 1410 to 1412 as shown in the figure, and the operator accesses more detailed information of the respective items, downloads latest version software to be used in the fabrication apparatus from a software library presented by the vendor, and downloads operation guidance (help information) for the operator's reference. The maintenance information provided from the maintenance database includes the information on the above-described present invention, and the software library provides latest version software to realize the present invention.

Figure 13:
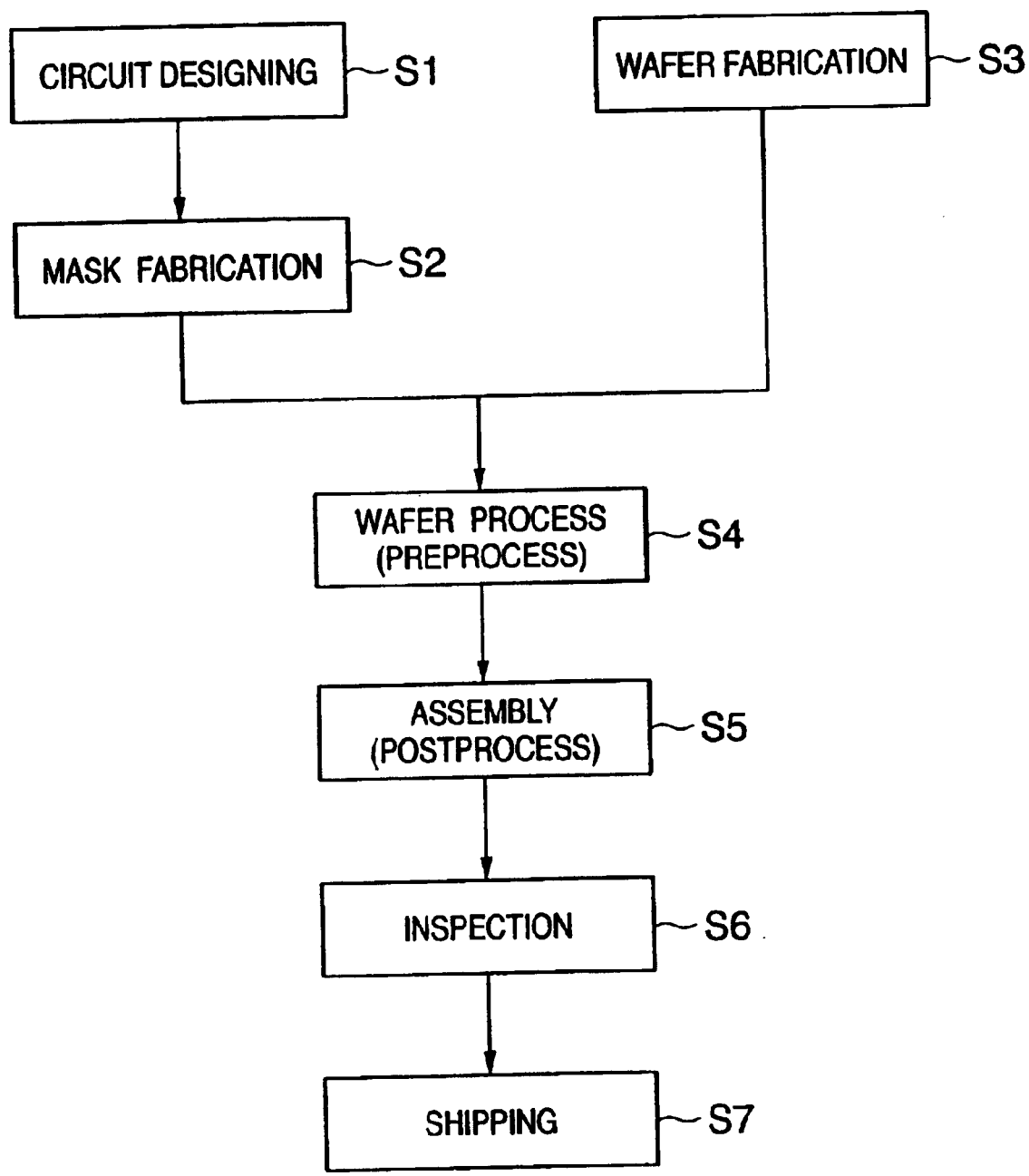
FIG. 13 is a flowchart showing a device fabrication process.

Next, a semiconductor device fabrication process utilizing the above-described production system will be described. FIG. 13 shows a flow of the entire semiconductor fabrication process. At step S1 (circuit designing), a circuit designing of the semiconductor device is performed. At step S2 (mask fabrication), a mask where the designed circuit pattern is formed is fabricated. On the other hand, at step S3 (wafer fabrication), a wafer is fabricated using silicon or the like. At step S4 (wafer process), called a preprocess, the above mask and wafer are used. An actual circuit is formed on the wafer by lithography. At step S5 (assembly), called a postprocess, a semiconductor chip is formed by using the wafer at step S4. The postprocess includes processing such as an assembly process (dicing and bonding) and a packaging process (chip sealing). At step S6 (inspection), inspections such as an operation test and a durability test are performed on the semiconductor device assembled at step S5. The semiconductor device is completed through these processes, and it is shipped (step S7). The preprocess and the postprocess are independently performed in specialized factories, and maintenance is made for these factories by the above-described remote maintenance system. Further, data communication is performed for production management and/or apparatus maintenance between the preprocess factory and the postprocess factory via the Internet or private-line network.

Figure 14:
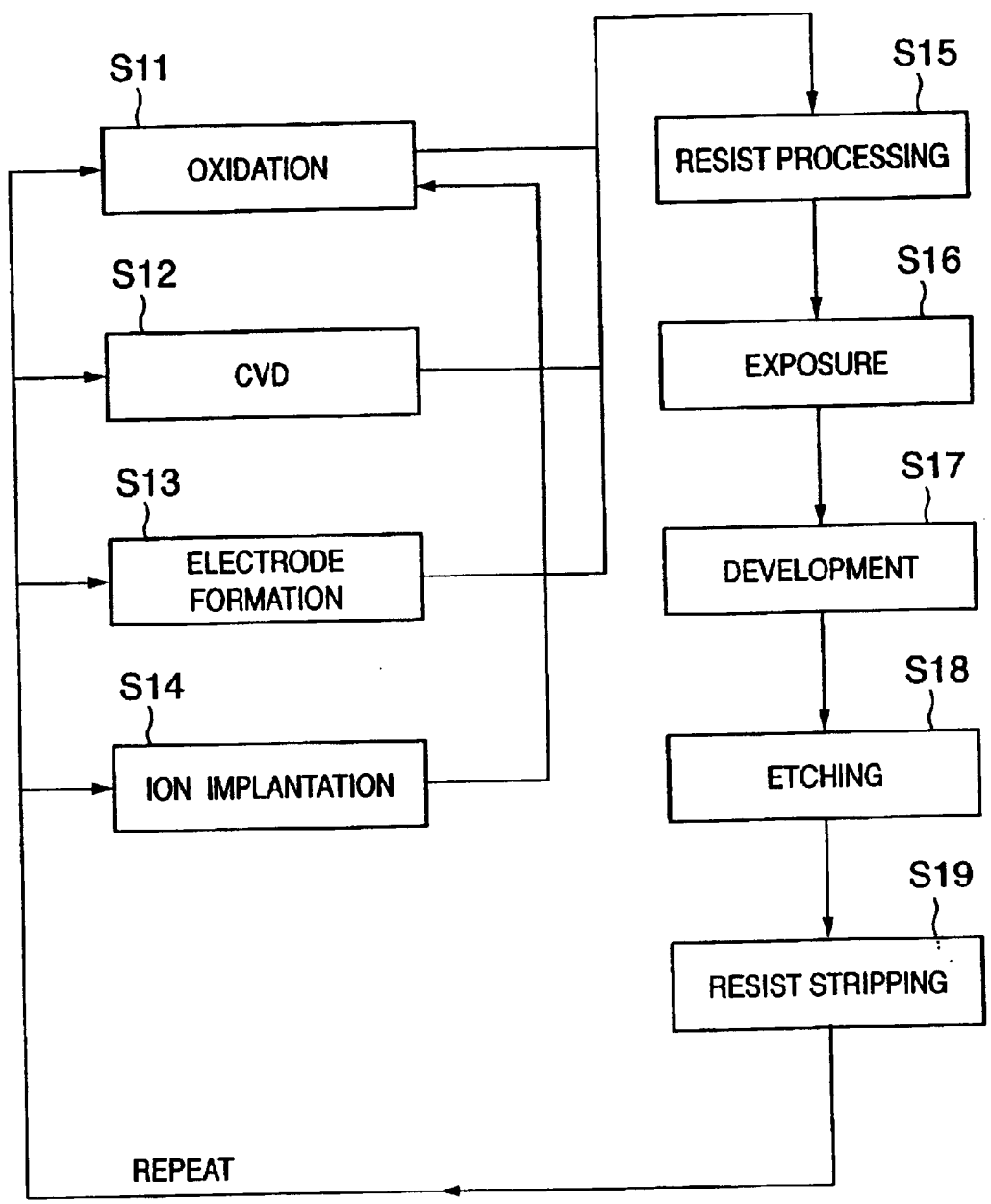
FIG. 14 is a flowchart showing a wafer prosess.

FIG. 14 shows a more detailed flow of the wafer process. At step S11 (oxidation), the surface of the wafer is oxidized. At step S12 (CVD), an insulating film is formed on the surface of the wafer. At step S13 (electrode formation), electrodes are formed by vapor deposition on the wafer. At step S14 (ion implantation), ions are injected into the wafer. At step S15 (resist processing), the wafer is coated with photoresist. At step S16 (exposure), the above-described exposure apparatus exposure-transfers the circuit pattern of the mask onto the wafer. At step S17 (development), the exposed wafer is developed. At step S18 (etching), portions other than the resist image are etched. At step S19 (resist stripping), the resist unnecessary after the etching is removed. These steps are repeated, thereby multiple circuit patterns are formed on the wafer. As maintenance is performed on the fabrication apparatuses used in the respective steps by the above-described remote maintenance system, trouble is prevented, and even if it occurs, quick recovery can be made. In comparison with the conventional art, the productivity of the semiconductor device can be improved.

The present invention is not limited to the above embodiments and various changes and modifications can be made within the spirit and scope of the present invention. Therefore, to appraise the public of the scope of the present invention, the following claims are made.

What is claimed is:

1. An exposure apparatus which exposes a substrate to a pattern, said apparatus comprising:
   a channel which causes pure water to flow as a coolant;
   a temperature adjustment unit which adjusts a temperature of the pure water flowing in said channel;
   a quality detection unit which detects the quality of the coolant; and
   a coolant generation device which generates the pure water flowing in said channel as the coolant,
   wherein a supply amount of the coolant is controlled on the basis of a detection result of said quality detection unit.

2. The apparatus according to claim 1, wherein the coolant is supplied from the coolant generation device arranged outside said apparatus.

3. An exposure apparatus which exposes a substrate to a pattern, said apparatus comprising:
   a channel which causes water to flow as a coolant;
   a temperature adjustment unit which adjusts a temperature of the coolant flowing in said channel; and
   a deoxidation unit which performs deoxidation processing from the coolant flowing in said channel,
   wherein said deoxidation unit has a deaeration function of removing gas from the coolant, and
   wherein said deoxidation unit fills a vessel which temporarily stores the coolant with gas having a partial oxygen pressure of substantially zero.

4. An exposure apparatus which exposes a substrate to a pattern, said apparatus comprising:
   a channel which causes water to flow as a coolant; and
   a temperature adjustment unit which adjusts a temperature of the coolant flowing in said channel,
   wherein the temperature adjustment unit suppresses an increase in a dissolved oxygen amount of the coolant.

5. The apparatus according to claim 4, wherein the increase in the dissolved oxygen amount of the coolant is suppressed by filling a vessel which temporarily stores the coolant in said temperature adjustment unit with inert gas, or blowing inert gas into the coolant in the vessel.

6. An exposure apparatus which exposes a substrate to a pattern, said apparatus comprising:
   a circulation channel which circulates distilled water or pure water as a coolant;
   a supply channel which supplies the coolant to said circulation channel;
   an exhaust channel which exhausts the coolant outside said circulation channel;
   a stage which aligns the substrate; and
   a motor for driving said stage,
   wherein a temperature of a motor coil is adjusted by the coolant flowing in said circulation channel, and
   wherein said apparatus further comprises a quality detection unit which detects the quality of the coolant, and a supply amount of the coolant is controlled on the basis of a detection result of said quality detection unit.

7. An exposure apparatus which exposes a substrate to a pattern, said apparatus comprising:
   a channel which causes a coolant to flow;
   a temperture adjustment unit which adjust a temperature of the coolant;

a quality detection unit which detects the quality of the coolant; and a pure water generation device which generates pure water flowing in said channel, wherein a supply amount of the pure water is controlled on the basis of a detection result of said quality unit.

8. An exposure apparatus which exposes a substrate to a pattern, said apparatus comprising:

a circulation channel which circulates distilled water or pure water as a coolant;

a supply channel which supplies the coolant to said circulation channel;

an exhaust channel which exhausts the coolant outside said circulation channel, wherein the coolant supplied from the supply channel is part of distilled water or pure water generated for use with an apparatus other than the exposure apparatus in a factory; and a quality detection unit which detects the quality of the coolant in the circulation channel, wherein a supply amount of the coolant is controlled on the basis of a detection result of said quality detection unit.

9. An exposure apparatus which exposes a substrate to a pattern, said apparatus comprising:

a channel which causes water to flow as a coolant; and a temperture adjustment unit which adjust a temperature of the coolant flowing in said channel, wherein the temperature adjustment unit suppresses an increase in an amount of dissolved gases in the coolant.

\* \* \* \* \*

UNITED STATES PATENT AND TRADEMARK OFFICE
CERTIFICATE OF CORRECTION

PATENT NO.        : 7,038,759 B2  
APPLICATION NO. : 10/187841  
DATED               : May 2, 2006  
INVENTOR(S)      : Keiji Emoto et al.

It is certified that error appears in the above-identified patent and that said Letters Patent is hereby corrected as shown below:

ON THE TITLE PAGE:
Item "(56) References Cited," under "FOREIGN PATENT DOCUMENTS," the sixth-listed document "JP    1-245893    10/1998" should read -- JP    1-245893    10/1989 --.

COLUMN 2:
Line 1, "possible to" should read -- possible --.
Line 5, "bulky" should read -- bulky, --.

COLUMN 4:
Line 31, "unpreferable" should read -- undesirable --.
Line 48, "unpreferable" should read -- undesirable --.

COLUMN 5:
Line 17, "manufacturing via" should read -- manufacturing factory and another semiconductor manufacturing factory via --.

COLUMN 6:
Line 36, "prosess." should read -- process. --.

COLUMN 7:
Line 49, "rust" should read -- rusting --.
Line 52, "$Fe+(1/2)O_2+7H_2O=Fe(H_2O)_6^2+2OH$" should read as follows:

-- $Fe+(1/2)O_2+7H_2O=Fe(H_2O)_6^2+2OH^-$ --.
Line 63, "(rust" should read -- (rusting --.

COLUMN 8:
Line 29, "like) The" should read -- like). The --.
Line 51, "unpreferable" should read -- undesirable --.

COLUMN 11:
Line 13, "deoxidatiori" should read -- deoxidation --.
Line 15, "(deacrated" should read -- (deaerated --.
Line 28, "critenon" should read -- criterion --.

COLUMN 12:
Line 16, "circulating" should read -- the circulating --.
Line 21, "pure" should read -- the pure --.
Line 27, "pure" should read -- the pure --.
Line 36, "deacrated" should read -- deaerated --.

UNITED STATES PATENT AND TRADEMARK OFFICE
CERTIFICATE OF CORRECTION

PATENT NO. : 7,038,759 B2
APPLICATION NO. : 10/187841
DATED : May 2, 2006
INVENTOR(S) : Keiji Emoto et al.

It is certified that error appears in the above-identified patent and that said Letters Patent is hereby corrected as shown below:

COLUMN 13:
    Line 44, "other band," should read -- other hand, --.

COLUMN 14:
    Line 9, "(LSDN" should read -- (ISDN --.

COLUMN 16:
    Line 2, "appraise" should read -- apprise --.
    Line 67, "adjust" should read -- adjusts --.

COLUMN 17:
    Line 6, "quality unit." should read -- quality detection unit. --.

COLUMN 18:
    Line 10, "temperture" should read -- temperature --.
    Line 13, "temperture" should read -- temperature --.

Signed and Sealed this

Fifth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,038,759 B2  Page 1 of 1
APPLICATION NO. : 10/187841
DATED : May 2, 2006
INVENTOR(S) : Emoto et al.

It is certified that error appears in the above-identified patent and that said Letters Patent is hereby corrected as shown below:

On the Title page, and item 45

Item [*] Notice: Subject to any disclaimer, the term of this patent is extended or adjusted under 35 USC 154(b) by (0) days Delete the phrase "by 0" and insert -- by 92 days--

Signed and Sealed this

Sixteenth Day of January, 2007

JON W. DUDAS
*Director of the United States Patent and Trademark Office*